(12) United States Patent
Lee et al.

(10) Patent No.: US 11,482,426 B2
(45) Date of Patent: Oct. 25, 2022

(54) DOUBLE PATTERNING METHOD

(71) Applicant: Taiwan Semiconductor Manufacturing Co., Ltd., Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 95 days.

(21) Appl. No.: 17/152,839

(22) Filed: Jan. 20, 2021

(65) Prior Publication Data

US 2021/0143020 A1 May 13, 2021

Related U.S. Application Data

(63) Continuation of application No. 16/837,252, filed on Apr. 1, 2020, now Pat. No. 11,177,138, which is a continuation of application No. 16/161,374, filed on Oct. 16, 2018, now Pat. No. 10,651,047, which is a continuation of application No. 15/648,604, filed on Jul. 13, 2017, now Pat. No. 10,109,497, which is a continuation of application No. 14/935,792, filed on (Continued)

(51) Int. Cl.
| | |
|---|---|
| *H01L 21/311* | (2006.01) |
| *H01L 21/768* | (2006.01) |
| *H01L 21/033* | (2006.01) |
| *H01L 21/027* | (2006.01) |

(52) U.S. Cl.
CPC ...... *H01L 21/31144* (2013.01); *H01L 21/027* (2013.01); *H01L 21/0337* (2013.01); *H01L 21/76816* (2013.01); *H01L 21/76832* (2013.01); *H01L 21/76883* (2013.01)

(58) Field of Classification Search
CPC ............ H01L 21/31144; H01L 21/027; H01L 21/0337; H01L 21/76816; H01L 21/76832; H01L 21/76883
See application file for complete search history.

(56) References Cited

U.S. PATENT DOCUMENTS 7,709,396 B2    5/2010   Bencher et al.
8,312,394 B2 *  11/2012  Ban .................... G06F 30/39
                                              716/54

(Continued)

OTHER PUBLICATIONS

Non-Final Office Action dated Mar. 16, 2015 for U.S. Appl. No. 13/920,201.

(Continued)

*Primary Examiner* — Julio J Maldonado
*Assistant Examiner* — Andre C Stevenson
(74) *Attorney, Agent, or Firm* — Eschweiler & Potashnik, LLC

(57) ABSTRACT

The present disclosure, in some embodiments, relates to a method of forming an integrated circuit. The method includes forming a hard mask over a dielectric layer of a substrate. A blocking layer is formed on the hard mask and spacers are formed over the blocking layer. The spacers laterally straddle opposing edges of the blocking layer. The hard mask is etched according to the spacers and the blocking layer. The dielectric layer is etched according to the hard mask.

20 Claims, 14 Drawing Sheets

Related U.S. Application Data

Nov. 9, 2015, now Pat. No. 9,711,372, which is a continuation of application No. 13/920,201, filed on Jun. 18, 2013, now Pat. No. 9,240,346.

(60) Provisional application No. 61/782,486, filed on Mar. 14, 2013.

(56) References Cited

U.S. PATENT DOCUMENTS

| | | | |
|---|---|---|---|
| 8,415,738 | B2 | 4/2013 | Nojima |
| 8,557,704 | B2 | 10/2013 | Wells et al. |
| 8,908,432 | B2 | 12/2014 | Kamei et al. |
| 9,711,372 | B2 | 7/2017 | Lee et al. |
| 10,109,497 | B2 | 10/2018 | Lee et al. |
| 10,651,047 | B2 | 5/2020 | Lee et al. |
| 2012/0273131 | A1* | 11/2012 | Wells ................ H01L 21/76816 118/504 |
| 2012/0292716 | A1 | 11/2012 | Liu et al. |

OTHER PUBLICATIONS

Notice of Allowance dated Sep. 14, 2015 for U.S. Appl. No. 13/920,201.
Non-Final Office Action dated Jun. 3, 2016 for U.S. Appl. No. 14/935,792.
Final Office Action dated Oct. 11, 2016 for U.S. Appl. No. 14/935,792.
Notice of Allowance dated Mar. 10, 2017 for U.S. Appl. No. 14/935,792.
Non-Final Office Action dated Jan. 12, 2018 for U.S. Appl. No. 15/648,604.
Notice of Allowance dated Jun. 13, 2018 for U.S. Appl. No. 15/648,604.
Non-Final Office Action dated Sep. 30, 2019 for U.S. Appl. No. 16/161,374.
Notice of Allowance dated Jan. 9, 2020 for U.S. Appl. No. 16/161,374.
Non-Final Office Action dated Dec. 30, 2020 for U.S. Appl. No. 16/837,252.

* cited by examiner

DOUBLE PATTERNING METHOD

REFERENCE TO RELATED APPLICATIONS

This application is a Continuation of U.S. application Ser. No. 16/837,252, filed on Apr. 1, 2020, which is a Continuation of U.S. application Ser. No. 16/161,374, filed on Oct. 16, 2018 (now U.S. Pat. No. 10,651,047, issued on May 12, 2020), which is a Continuation of U.S. application Ser. No. 15/648,604, filed on Jul. 13, 2017 (now U.S. Pat. No. 10,109,497, issued on Oct. 23, 2018), which is a Continuation of U.S. application Ser. No. 14/935,792, filed on Nov. 9, 2015 (now U.S. Pat. No. 9,711,372, issued on Jul. 18, 2017), which is a Continuation of U.S. application Ser. No. 13/920,201, filed on Jun. 18, 2013 (now U.S. Pat. No. 9,240,346, issued on Jan. 19, 2016), which claims the benefit of U.S. Provisional Application No. 61/782,486, filed on Mar. 14, 2013. The contents of the above-referenced Patent Applications are hereby incorporated by reference in their entirety.

BACKGROUND

In conventional photolithography a photoresist is exposed to light through a mask. The photoresist is modified by the exposure in such a way that either the exposed or unexposed portions of the resist can be removed during subsequent development. Any photolithographic process has limitations, whereby there is a critical dimension below which features are too fine to be resolved. That resolution limit is a critical barrier in reducing the scale of integrated circuit devices.

Self-aligned double patterning is a technique for forming features having a finer pitch than would be possible by the direct application of a photolithographic process. Self-aligned double patterning involves forming a mandrel having line-shaped features. A spacer formation process is then used to form spacers on the sides of the mandrel features. The mandrel is then stripped leaving the spacers defining two sets of lines. A first set of lines corresponds to the mandrel. A second set of lines is formed between each adjacent pair of the mandrel's line-shaped features, the second set of lines being form between adjacent spacers.

DETAILED DESCRIPTION

The line-shaped features produced by self-aligned double patterning have termini. The masks that form these termini take the form of small islands. These islands are ideally rectangular. In practice, these islands become rounded. When these rounded mask shapes are slightly misaligned with respect to the line-shaped features formed by self-aligned double patterning, the result can be acute corners that can lead to imperfect metal backfill. To avoid any backfill issues, the islands may be subjected to a supplemental trimming operation. Allowing for this supplemental trimming places a minimum on the distance between termini. The minimum distance between termini is generally much larger than the critical dimension for the photolithographic process.

The present disclosure relates to integrated circuit device manufacturing processes. The present disclosure provides self-aligned double patterning methods that can be used in back-end-of-line (BEOL) processing and other stages of integrated circuit device manufacturing. In these methods, line termini are masked prior to self-aligned double patterning. The self-aligned double patterning involves forming a mandrel, the shape of which is determined by a lithographic mask. That same lithographic mask is used prior to self-aligned double patterning to trim the mask that determines the locations of line termini. The methods provide precise positioning of the line termini mask relative to the line locations determined by self-aligned double patterning. The methods allow line termini to be placed more closely together than would otherwise be feasible.

Figure 1:
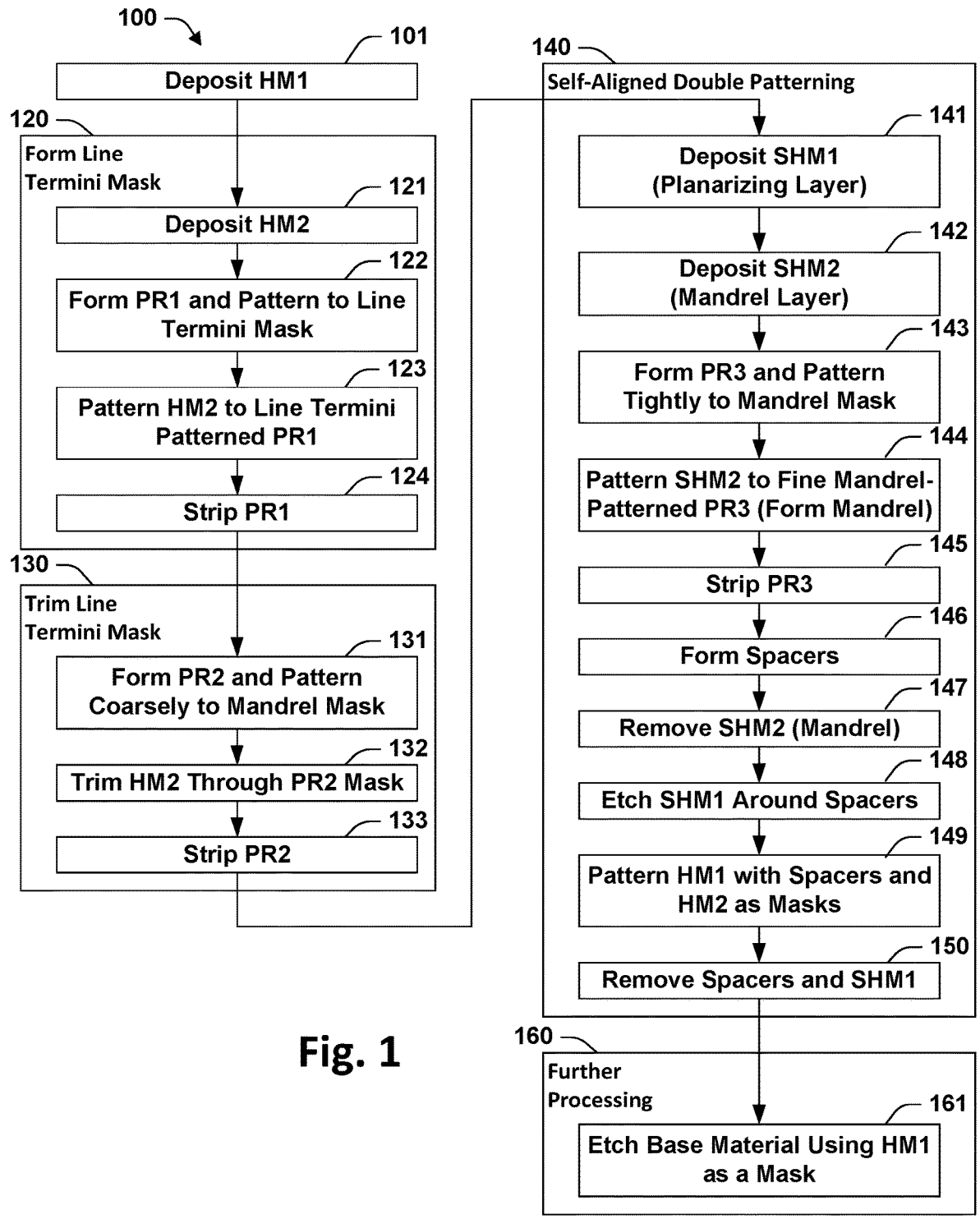
FIG. 1 is a flow chart of an integrated circuit manufacturing process that is an embodiment of a process provided by the present disclosure.

FIG. 1 provides a flow chart of an example process 100 of forming an example integrated circuit device 200 according to an embodiment of the present disclosure. The process 100 begins with act 101, forming a first hard mask layer (HM1) 203 on a substrate 201. The process 100 is concerned with patterning HM1 203 for use in treating the substrate 201. In some embodiments, the substrate 201 comprises a semiconductor body. In some embodiments, the treatment applied using the method 100 forms trenches in the substrate 201. However, the method 100 and the other example methods provided by the present disclosure can be used to apply any treatment requiring a mask to a substrate of any type or composition. The process 100 patterns HM1 203. The pattern can be one that has features finer than can be formed through photolithography without double patterning.

The process 100 continues with a group of acts 120 that form a second hard mask layer (HM2) 205 over HM1 203. HM2 205 will be shaped by process 100 to define the positions at which line-shaped openings that will be formed into HM1 203 will terminate. In a following group of acts 130, HM2 205 is trimmed. The trimming process 130 trims the features of HM2 205 using a photolithography mask. That same mask will later be used to define the shape of a mandrel for self-aligned double patterning process 140. Trimming narrows the line termini-defining features of HM2 205 so as to trim these features in a way that determines the location of their boundaries that are parallel to the terminated lines. Trimming narrows the termini-defining features and centers them with respect to the terminated lines. This trimming and centering results in a consistent shape for the line termini and reduces the possibility of any defects that could be caused by irregularly shaped line termini.

Figure 2:
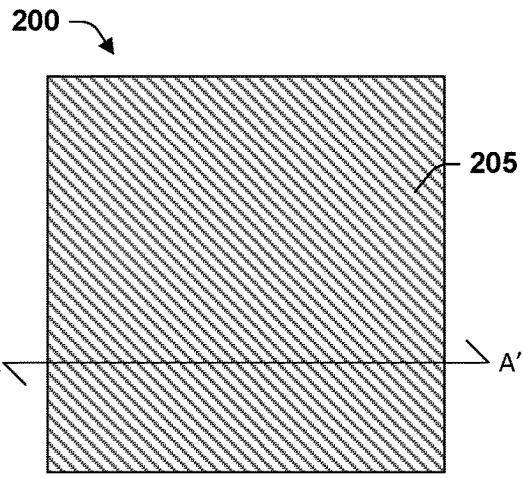
FIG. 2 provides a partial plan view of an example integrated circuit device to which the process of FIG. 1 can be applied.
Figure 3:
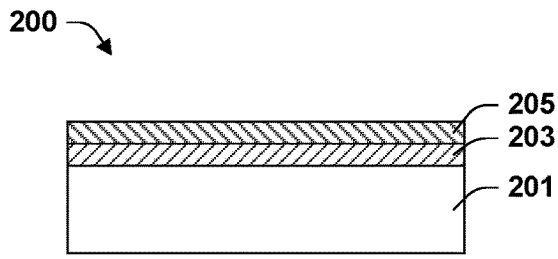
FIG. 3 is a cross section of the device illustrated by FIG. 2 taken along the line A-A'.

The series of acts 120 begins with act 121, which is forming the layer HM2 205 over HM1 203. An example embodiment of the resulting structure is illustrated in FIGS. 2 and 3 by partially-formed integrated circuit device 200. FIG. 2 provides a plan view of the device 200. FIG. 3 provides a cross-section of the device 200 taken along the line A-A' of FIG. 2.

Figure 4:
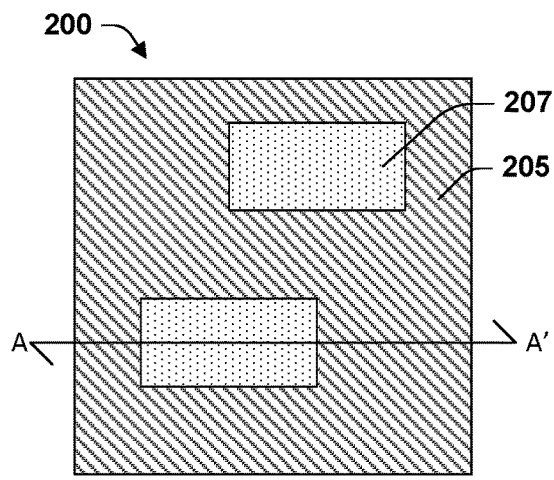
FIGS. 4-25 are a series of paired plan and cross-sectional views showing progression of the example integrated circuit device of FIGS. 2 and 3 through processing by the method of FIG. 1.
Figure 5:
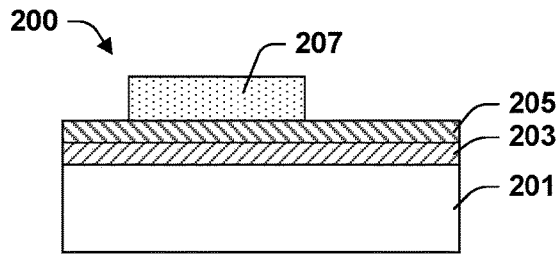

The series of acts 120 continues with act 122, forming a photoresist (PR1) 207 and patterning PR1 207. The pattern determines the locations 243 where lines 241 defined by subsequent self-aligned double patterning 140 will terminate. These locations are identified in FIG. 6 and in FIG. 24, which will be discussed in more detail subsequently. PR1 207 masks the substrate 201 where the lines 241 will terminate. The structure of PR1 207 following act 122 is illustrated in FIGS. 4 and 5.

Figure 6:
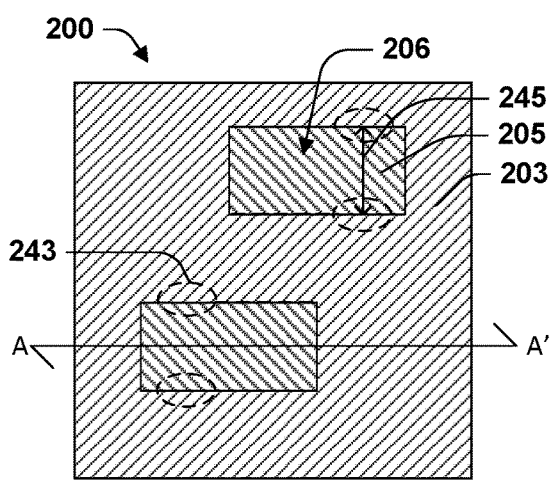
Figure 7:
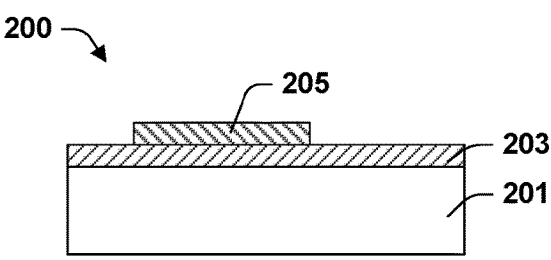

Act 123 applies the pattern of PR1 207 to HM2 205 as illustrated by FIGS. 6 and 7. Act 122 is an etching operation in which PR1 207 operates as a mask and HM1 203 operates as an etch stop layer. In some embodiments, HM1 203 is a single layer of material and the etching conditions for act 123 are chosen to remove the materials of HM2 205 at a higher rate than the material of HM1 203. Following act 123, the patterning of HM2 205 determines the locations 243 where lines 241 that will be formed by self-aligned double patterning 140 will terminate. Following act 123, PR1 can be stripped by act 124.

Act 123 patterns HM2 205 into islands 206, which are identified in FIG. 6. The islands 206 will mask portions of the substrate 201 during further process 161. Lines 241 will terminate at locations 243, which bound the vertical extent of islands 206. The following series of acts 130 reduces the horizontal extent of the islands 206. By reducing and accurately determining the horizontal extent of the islands 206, lines 241 can be terminated reliably, which in turn allows the end-to-end spacing 245 to be made smaller than would otherwise be feasible.

Figure 8:
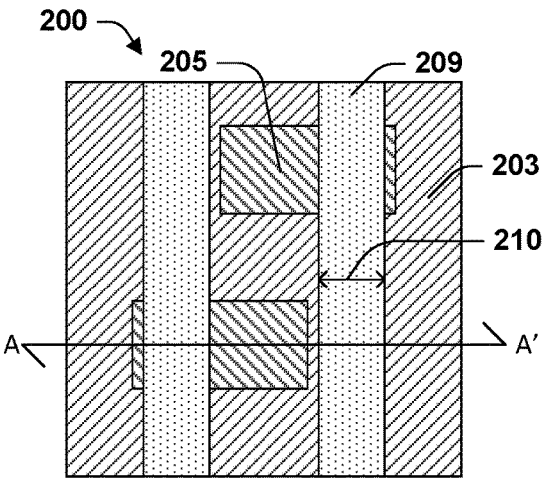
Figure 9:
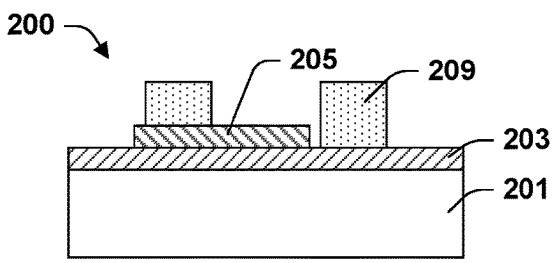

The series of acts 130 that trim HM2 205 begin with act 131, which is forming a photoresist (PR2) 209 and patterning PR2 209 using a photolithographic mask PM1 (not shown in the figures). PM1 is used again in act 143 to pattern a photoresist (PR3 215), that will shape the mandrel for self-aligned double patterning 140. Act 131 shapes PR2 209 into lines of width 210, as illustrated by FIGS. 8 and 9.

Figure 10:
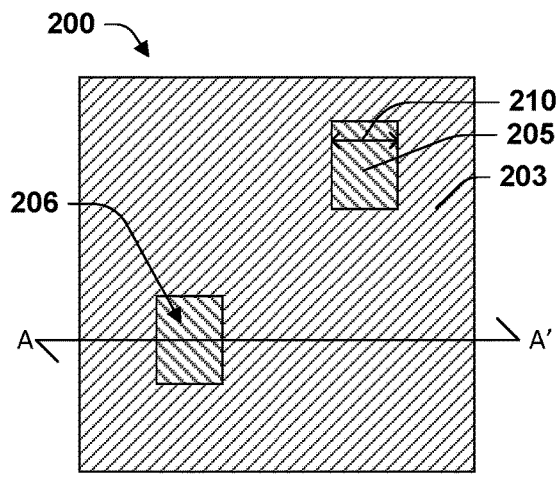
Figure 11:
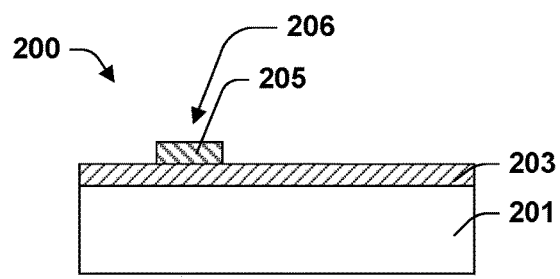

Act 132 is an etching operation that trims HM2 205 where it is not masked by PR2 209. Act 132 trims HM2 205 as illustrated by FIGS. 10 and 11. Act 132 is an etching operation in which PR2 209 operates as a mask and HM1 203 operates as an etch stop layer. In some embodiments, HM1 203 is a single layer of material and the etching conditions for act 132 are chosen to remove the materials of HM2 205 at a higher rate than the material of HM1 203. Following act 132, PR2 can be stripped by act 133.

In some alternative embodiments, the acts 120 that form the line termini mask and the acts 130 that trim the line termini mask are combined to use one photoresist. For example, after PR1 is exposed through the line termini mask in act 122, PR1 can be exposed again through the mandrel mask in a counterpart to act 131. HM2 203 can then be patterned in one action that combines acts 123 and 132.

Following acts 130, which complete the patterning of HM2 205, the process 100 proceeds with self-aligned double patterning 140. Self-aligned double patterning 140 begins with act 141, which forms sacrificial hard mask layer (SHM1) 211. SHM1 211 overlies HM1 203 and HM2 205 and provides a planar surface on which a mandrel and spacers can be formed. In some embodiments, SHM1 211 is eliminated and HM1 203 and HM1 205 provide the etch stop functionality otherwise provided by SHM1 211. Eliminating act 141 and SHM1 211 simplifies the process 100. In most embodiments, however, SHM1 211 is included to avoid the possibilities of spacers forming along sidewalls of HM2 205.

SHM1 211 can contain multiple layers of disparate materials. In the embodiment 200 illustrated by FIGS. 12 and 13, SHM1 211 includes two layer, layers 217 and 218. In some embodiments, the upper layer 218 provides the functionality of an etch stop layer. In some embodiments, the upper layer 218 provides the functionality of an antireflective coating. In some embodiments, the upper layer 218 provides both of these functionalities. The composition of SHM1 211 and the number of layers it contains can be selected to provide the etch selectivity required during subsequent processing.

Figure 12:
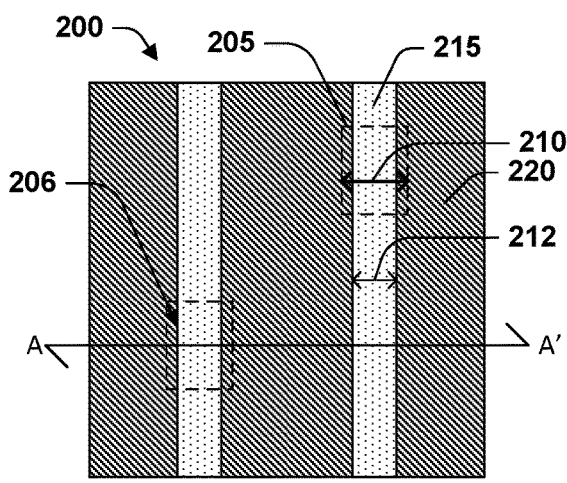
Figure 13:
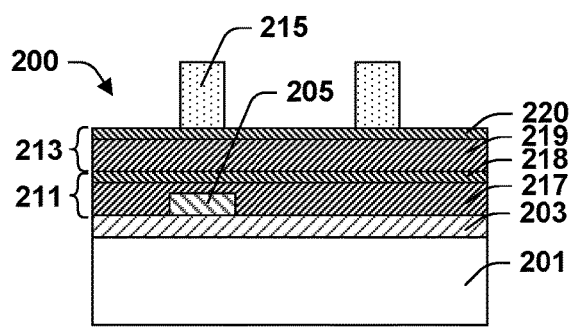

Act 142 forms sacrificial hard mask layer (SHM2) 213, which is the layer that is patterned to form the mandrel. As illustrated by FIGS. 12 and 13, for the example device 200 SHM2 213 includes two layers, layers 219 and 220. In some embodiments, the upper layer 220 provides an antireflective coating. The composition of SHM2 213 and the number of layers it contains can be selected to provide the etch selectivity required during subsequent processing.

Act 143 forms and patterns a photoresist (PR3) 215 over SHM1 211 and SHM2 213.

PR3 215 is patterned to the form of a mandrel as shown in FIGS. 12 and 13. PR3 215 is patterned using the photolithographic mask PM1, which is the same mask previously used to pattern PR2 209 in act 122 for trimming HM2 in act 123. Photolithography shapes PR3 209 into lines of width 212.

As can be seen in FIG. 12, the width 212 is smaller than the width 210 even though these line widths result from application of the same photolithographic mask PM1. The difference in widths is desirable to ensure that the islands 206 of HM2 205 are sufficiently broad to serve their function of terminating lines. In some embodiments, the difference between the width 210 and the width 212 is equal to at least twice the uncertainty in the alignment of photolithographic mask PM1 with respect to the device 200. In some embodiments, the width 210 is greater than the width 212 by an amount equal to from about 10% to about 180% the width of spacer 221, which are formed by act 146. In some embodiments, the width 210 is from 3 nm to 30 nm greater than the width 212. The difference in width can be achieved by varying the conditions of exposure, varying the chemistry of the photoresists PR2 209 and PR3 215, or a combination of the two. In some embodiments, PR2 209 is a positive photoresist and is under exposed in act 131. In some embodiments, PR3 215 is a positive photoresist and is over exposed in act 145. In some embodiments, PR2 209 is exposed for a longer period than PR3 215.

Figure 14:
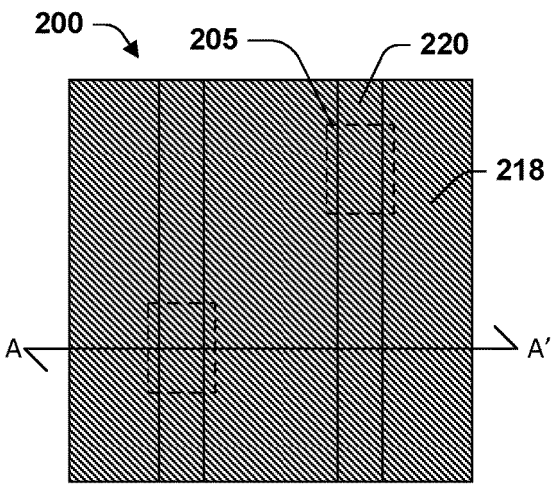
Figure 15:
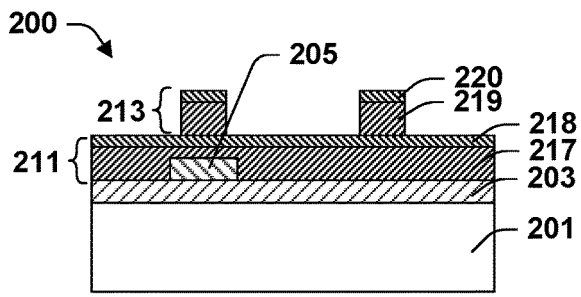

Act 144 applies the pattern of PR3 215 to SHM2 213 thereby forming SHM2 213 into a mandrel as illustrated by FIGS. 14 and 15. Act 144 is an etching operation with PR3 215 providing the mask and the upper surface of SHM1 211 (layer 218) providing an etch stop. Any suitable etch process can be used. In one example, act 144 includes an initial breakthrough etch to penetrate the layer 220 followed by a main etch. While in most embodiments, the main etch has a high selectivity for removing the material of layer 219 over the material of layer 218, the breakthrough etch does not require this selectivity and can have the opposite selectivity. Following act 144, PR3 215 can be stripped by act 145.

Act 143 forms PR3 219 to the shape of the mandrel. As can be seen by comparing FIGS. 12-13 and FIGS. 14-15, acts 144 and 145 transfer the mandrel shape of PR3 219 to SHM2 213. In some examples, a photoresist material is suited to the function of SHM2 213 and can serve as the mandrel. Accordingly, in some embodiments, PR3 219 is used in place of SHM2 213 and acts 142, 144, and 145 are eliminated.

Figure 16:
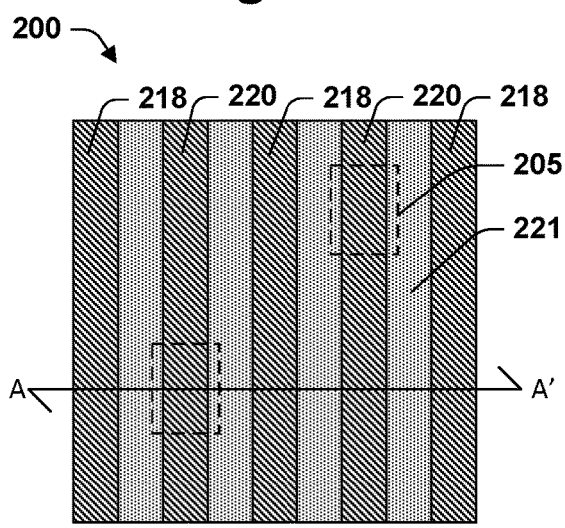
Figure 17:
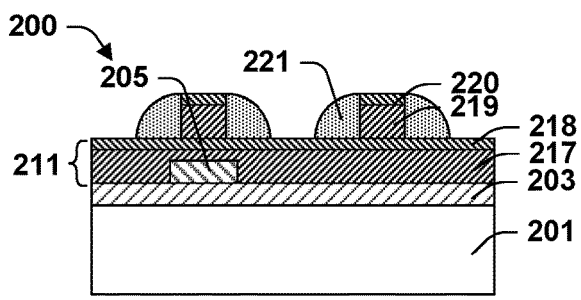

Act 146 forms spacers 221 adjacent the features of SHM2 213 (the mandrel) to produce a structure as illustrated in FIGS. 16 and 17. In other words, act 146 forms spacers to the sides of SHM2 213. Act 146 can include depositing a spacer material, then etching anisotropically to form spacers 221. Spacers 221 can be formed from any suitable material. Examples of materials that can be suitable include SiO, SiN, TiO, TiN, Ta, and TaN. The material can be deposited by any suitable method, for example ALD or CVD. Etching conditions can be typical for spacer formation.

Figure 18:
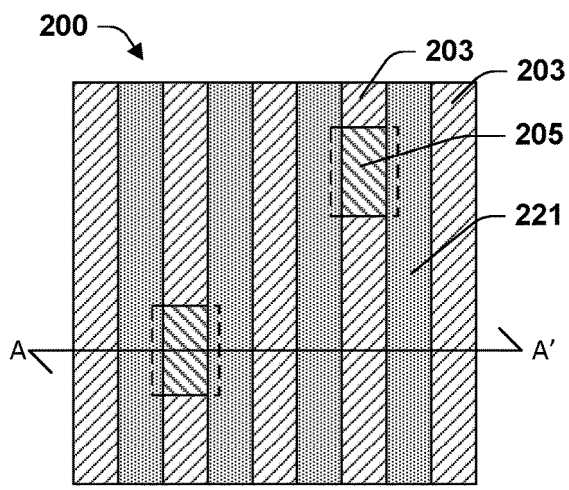
Figure 19:
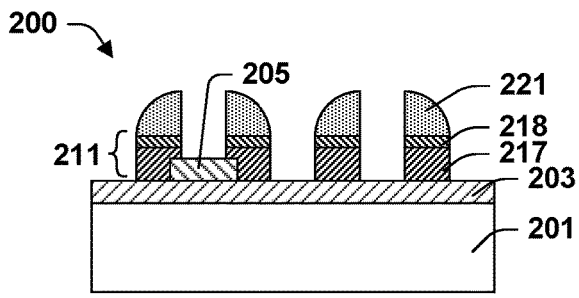

Act 147 removes the mandrel SHM2 213. Act 148 etches SHM1 except where masked by spacers 221. These two acts can be combined into a single etch process. In either case, the result is a structure as illustrated by FIGS. 18 and 19. Act 148, or the combined acts 147 and 148, are etch operations with spacers 221 providing a mask and HM2 205 providing an etch stop layer. HM1 203 can also be used as an etch stop layer, but this is not necessary in that the act 148, which follows, continues etching through HM1 203. Spacers 211 do not mask any part of SHM2 213, therefore SHM2 213 is removed entirely by act 147 regardless of whether acts 147 and 148 are combined. The etch can use conditions that vary to sequentially etch through the layers 220, 219, 218, and 217 while providing a desired etch rate and etch selectivity.

Figure 20:
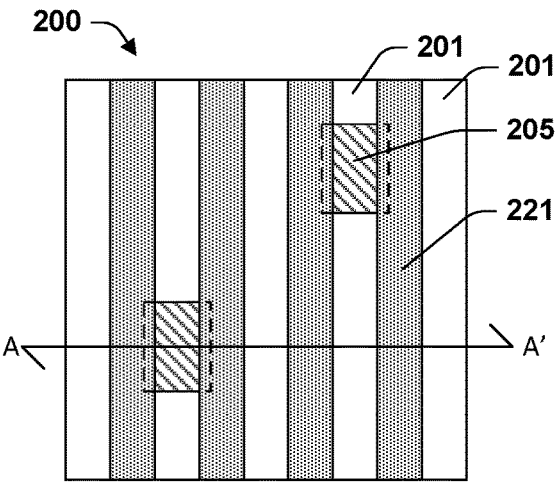
Figure 21:
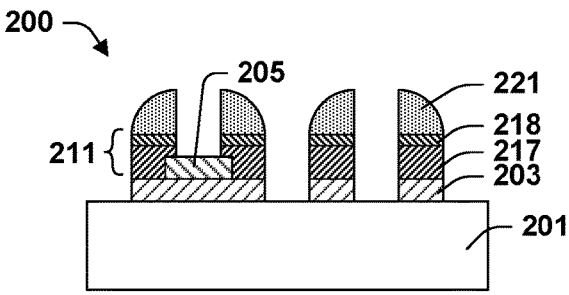

Act 149 etches HM1 203 except where HM1 203 is masked by either HM2 205 or spacers 221. FIGS. 20 and 21 provide an example of the resulting structure. Act 149 is an etch operation having conditions that selectively remove the material of HM1 203 over the material of HM2 205. The compositions of HM1 203 and HM2 205 can be selected to facilitate this operation.

Figure 22:
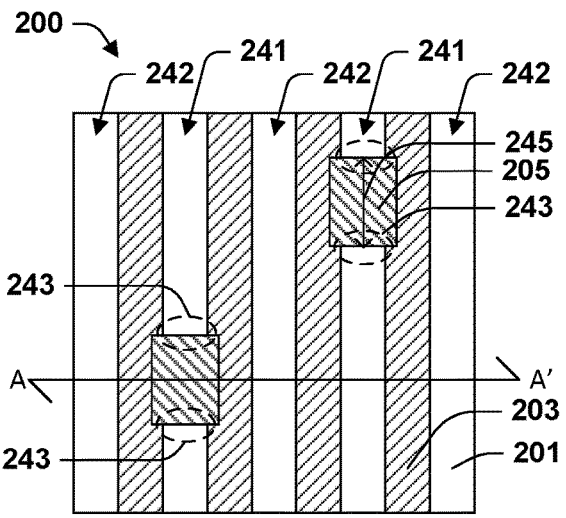
Figure 23:
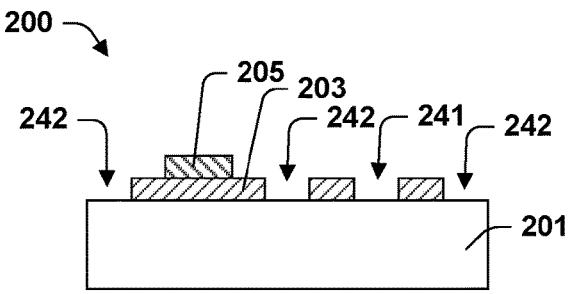

Act 150 removes spacers 221 and the remaining portion of SHM1 211. FIGS. 22 and 23 provide an example of the resulting structure. Act 150 can also remove HM2 205. Portions of the substrate 201 that are masked by HM2 205 are also masked by HM1 203, therefore HM2 205 is no longer required.

Self-aligned double patterning 140 patterns HM1 203 into a mask defining two sets of lines as illustrated in FIGS. 22 and 23. Lines 241 are in locations previously masked by the mandrel SHM2 213. Lines 241 are interleaved with lines 242. Lines 242 are formed between locations that were masked by spacers 221. Lines 241 have termini 243 identified in FIG. 22. The locations of termini 243 are determined by the patterning of HM2 205. The precise patterning of HM2 205 through acts 120 and 130 permits the distance 245 between termini 243 to be smaller than would otherwise be feasible.

Figure 24:
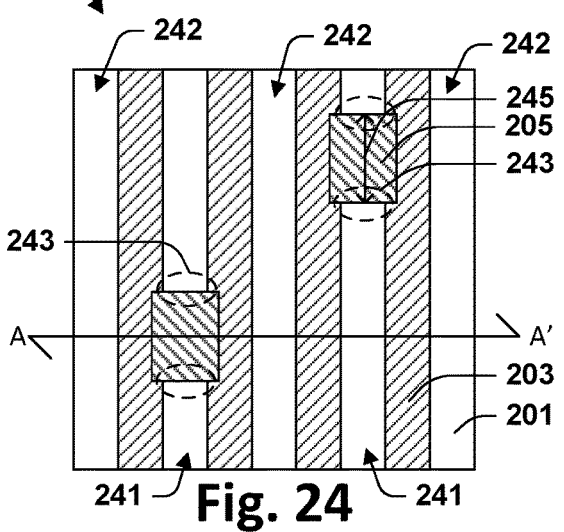
Figure 25:
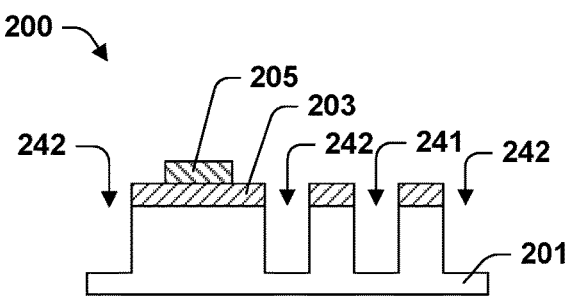

The series of act 160 are one or more acts in which the substrate 201 is processed using the patterned mask HM1 203. The processing can be any processing that is facilitated by HM1 203. Examples of processes that can be facilitated by patterned mask HM1 203 include etching and ion implantation. Act 161 is illustrative of the type of processing that is possible. Act 161 forms trenches in the substrate 201 as illustrated by FIGS. 24 and 25. Act 161 is an etch for which HM1 203 provides a mask. In some embodiments, the trenches are formed in a dielectric layer of substrate 201. In some embodiments, the dielectric is a low-k dielectric. In some embodiments, the trenches are formed as part of a damascene or dual damascene process that forms a metal interconnect structure for the device 200.

Figure 26:
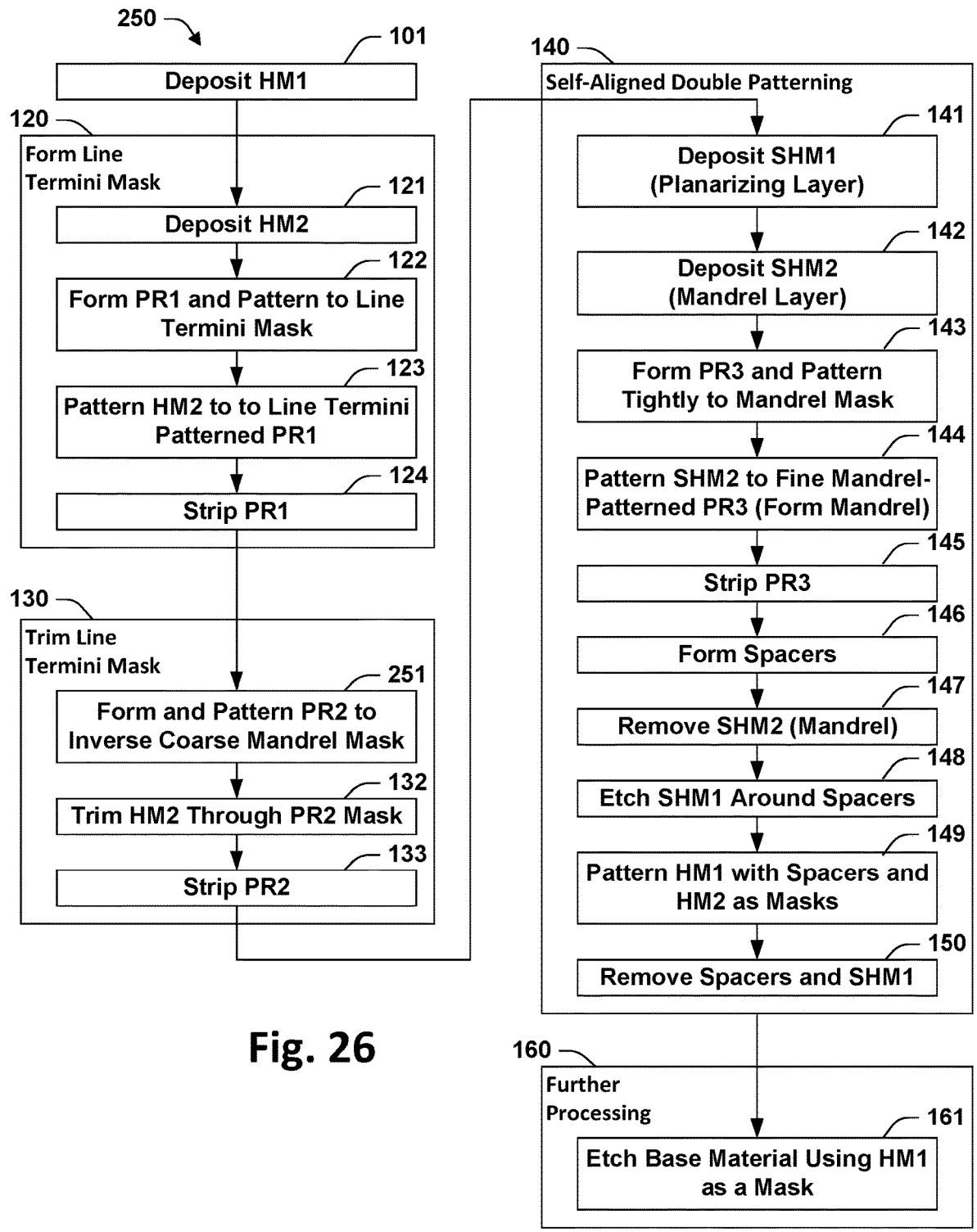
FIG. 26 is a flow chart of an integrated circuit manufacturing process that is an embodiment of another process provided by the present disclosure.

The process 100 provides an example of embodiments in which line termini 243 are formed for lines 241. FIG. 26 provides a flowchart of process 250, which is an example of embodiments in which line termini 243 are formed for lines 242. The components of process 250 are similar to those of process 100. The description of process 250 generally applies to process 100.

Figure 27:
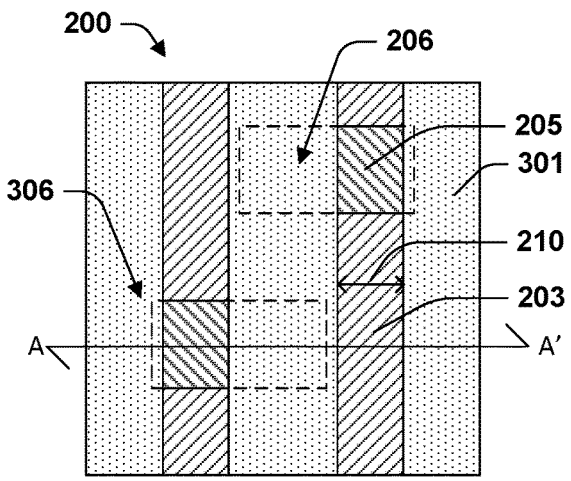
FIG. 27 provides a partial plan view of an example integrated circuit device to which the process of FIG. 26 can be applied.
Figure 28:
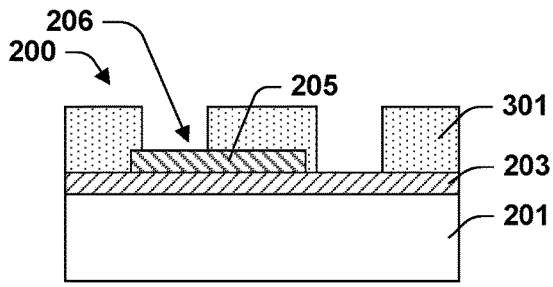
FIG. 28 is a cross section of the device illustrated by FIG. 27 taken along the line A-A'.

The principle difference is in the manner of patterning PR2 209 using the photolithographic mask PM1 for the purpose of trimming HM2 205. In act 131 of process 100, PR2 209 is a resist of the same type (positive or negative) as PR3 215. Process 250 substitutes act 251, which is the same as act 131 accept that PR2 301 is used instead. PR2 301 is a photoresist of the opposite type from PR3 215. Whereas act 131 produces a structure such as the one illustrated by FIGS. 8 and 9, act 251 produces a structure such as the one illustrated by FIGS. 27 and 28. Whereas act 131 shapes PR2 209 into lines of width 210, as illustrated by FIGS. 8 and 9, act 251 shapes PR2 310 in a mask with line-shaped gaps having width 210 as illustrated by FIGS. 27 and 28. PR2 310 is patterned to the inverse of PR2 209.

Figure 29:
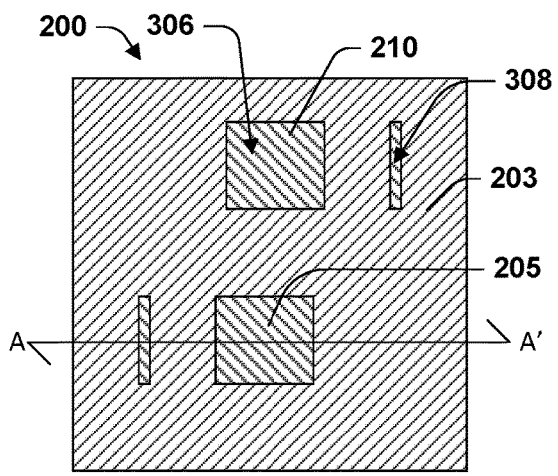
FIGS. 29-44 are a series of paired plan and cross-sectional views showing progression of the example integrated circuit device of FIGS. 27 and 28 through processing by the method of FIG. 26.
Figure 30:
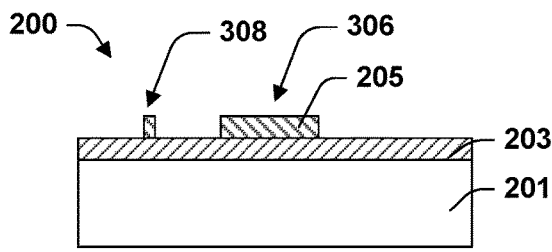
Figure 31:
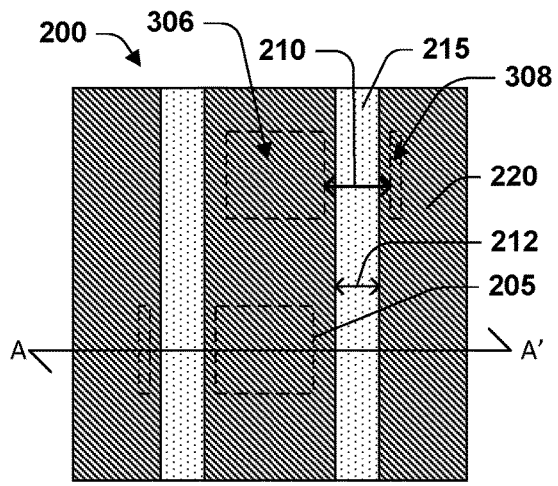
Figure 32:
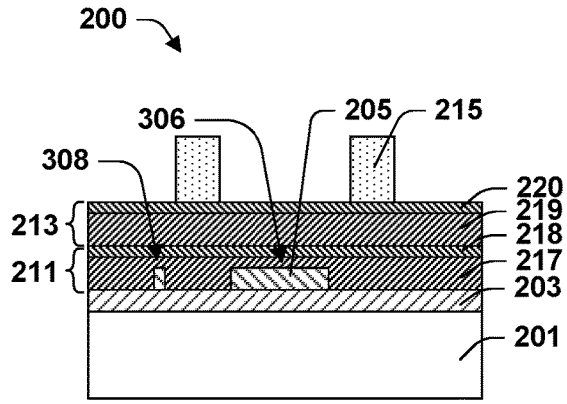
Figure 33:
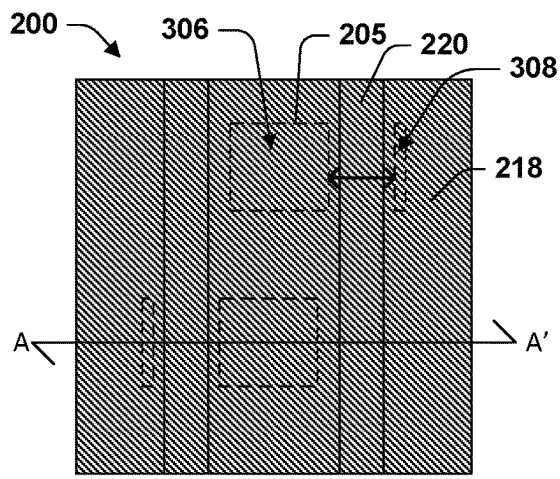
Figure 34:
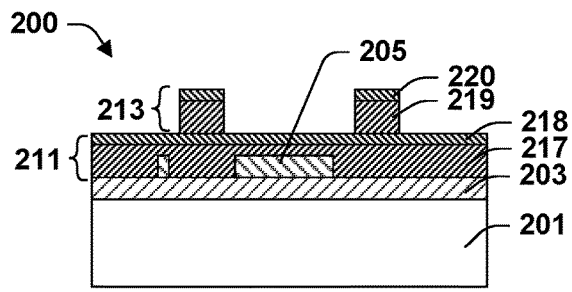
Figure 35:
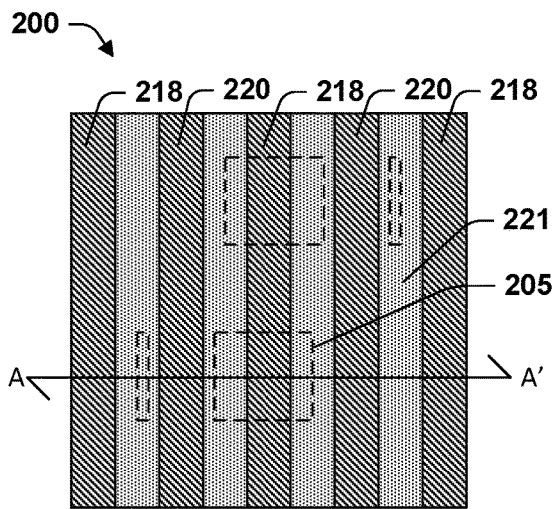
Figure 36:
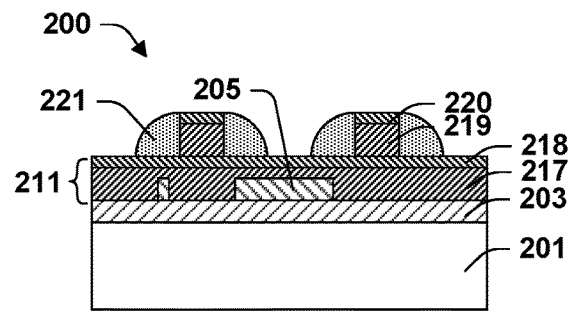
Figure 37:
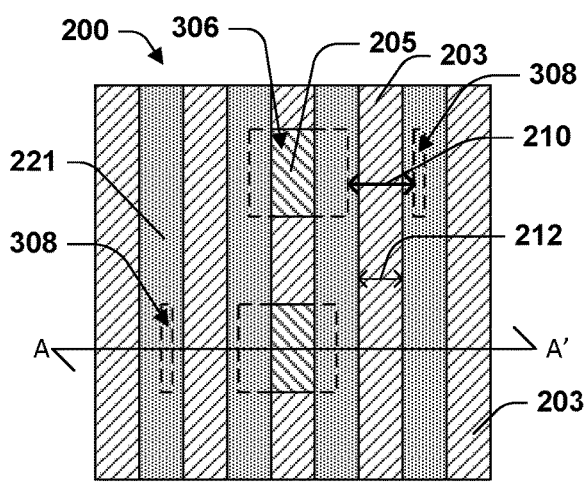

FIGS. 29-44 show how this change affects the device 200 through subsequent processing. In process 250, trimming 130 patterns HM2 205 to the form illustrated in FIGS. 29 and 30. In this form, HM2 205 includes islands 306 that will form termini for lines 242. Additional islands 308 may also remain. Additional islands 308 are located over areas of the substrate 201 that will be masked by spacers 221. Therefore, islands 308 have no significant effect on the final form of device 200.

Figure 38:
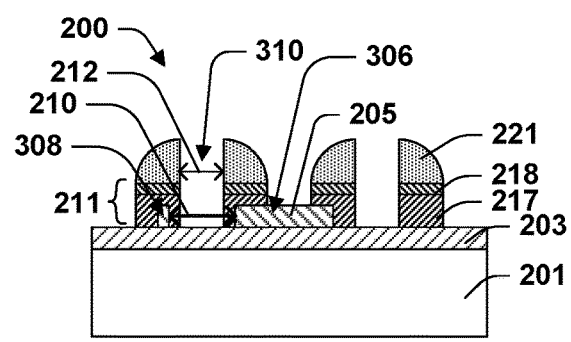
Figure 39:
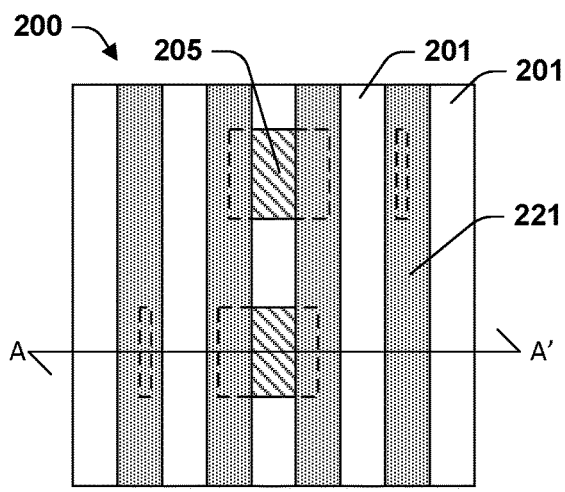
Figure 40:
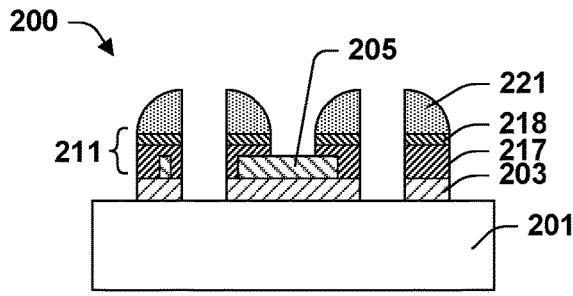
Figure 41:
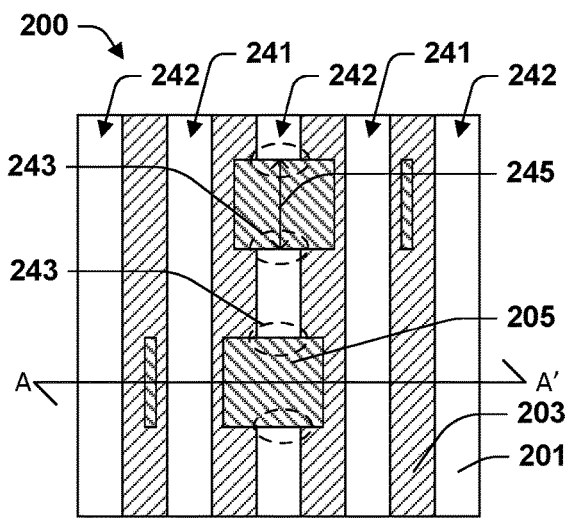
Figure 42:
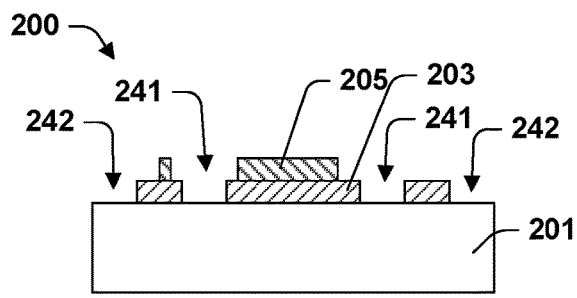
Figure 43:
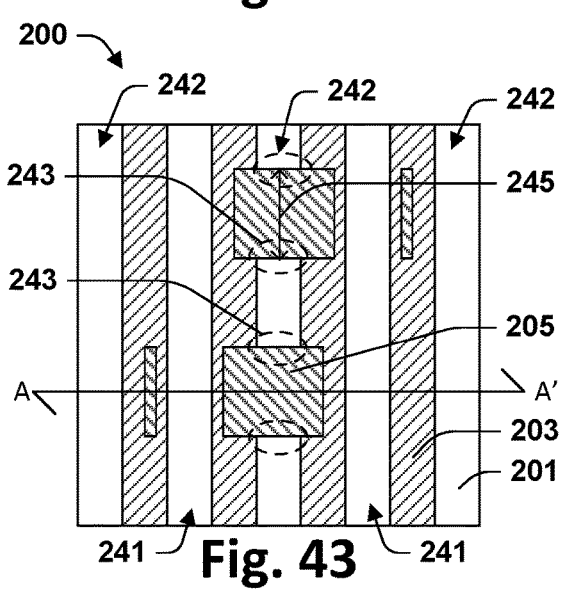
Figure 44:
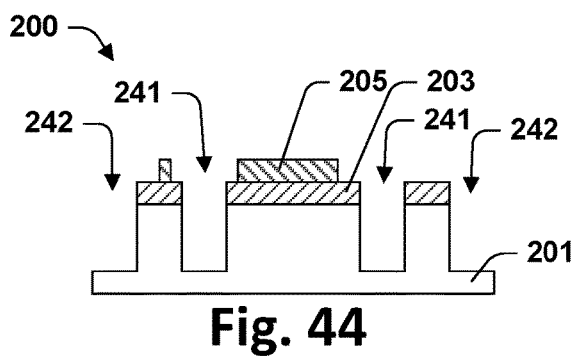

As shown in FIGS. 31-34, when SHM2 213 is formed and patterned into the mandrel SHM2 213, islands 306 and 308 flank mandrel features. After spacers 221 are formed and the mandrel SHM2 213 is removed as shown in FIGS. 35-38, the islands 306 and 308 flank the gaps 310 as shown in FIG. 38. As illustrated by FIGS. 39-44, the gaps 310 are the locations where lines 241 will be formed. Selecting the conditions for act 251 vis-à-vis the conditions for act 144 to make the width 210 greater than the width 212 allows for some difference in the alignment of photolithographic mask PM1 between its use in act 251 and its use again in act 144 without either of the islands 306 and 308 intruding into the gaps 310. Differences in width can be achieved by under or over exposure of the photoresist PR2 209 in act 251 or PR3 219 in act 141. Under exposure of a negative photoresist can be substituted for over exposure of a positive photoresist and vice versa. As for embodiments of process 100, in some embodiments of process 250 the difference between the width 210 and the width 212 is from about 3 nm to about 30 nm.

Figure 45:
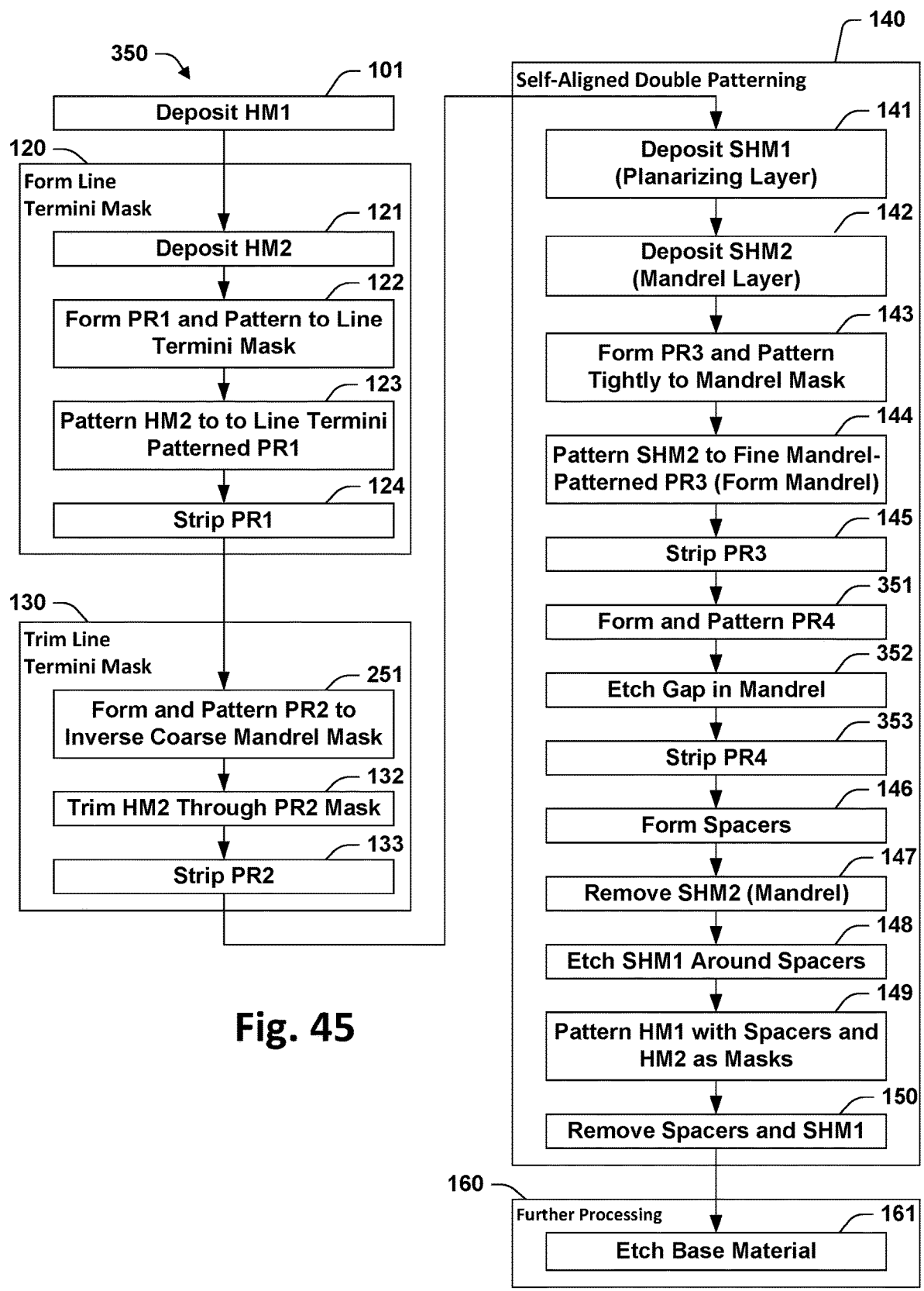
FIG. 45 is a flow chart of an integrated circuit manufacturing process that is an embodiment of yet another process provided by the present disclosure.

The process 100 provides an example of embodiments in which line termini 243 are formed for lines 241. The process 250 provides an example of embodiments in which line termini 243 are formed for lines 242. FIG. 45 provides a flowchart of process 350, which is an example of embodiments in which line termini 243 are formed for both lines 241 and lines 242.

Figure 52:
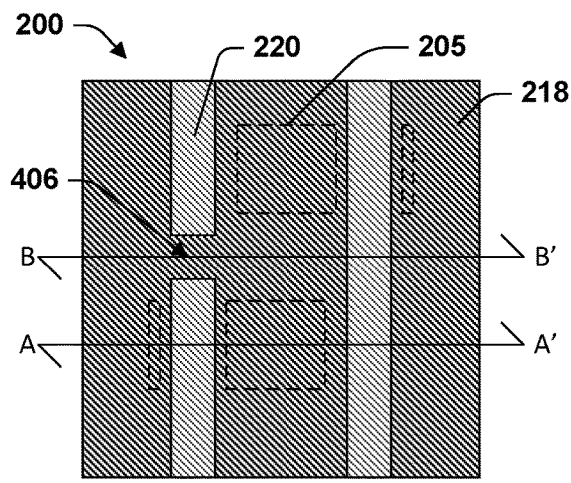
Figure 53:
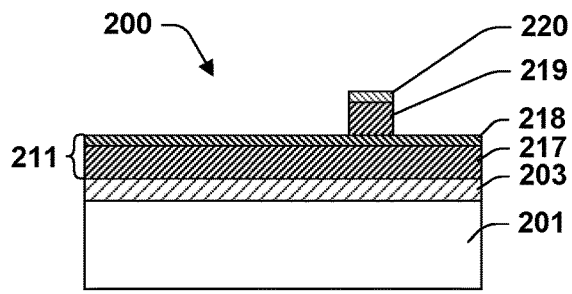
Figure 54:
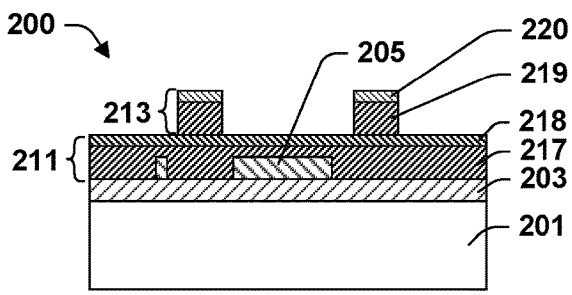
Figure 55:
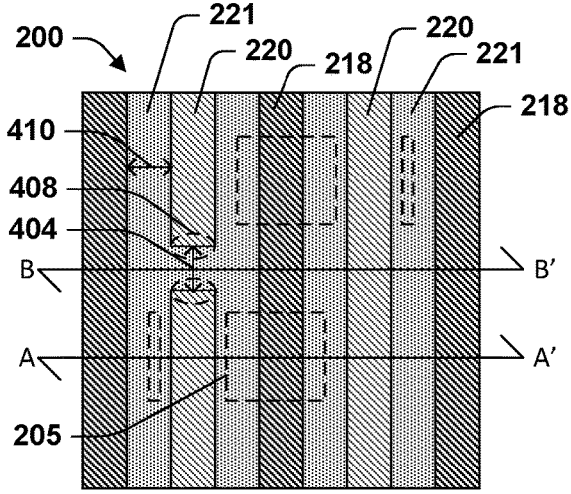
Figure 56:
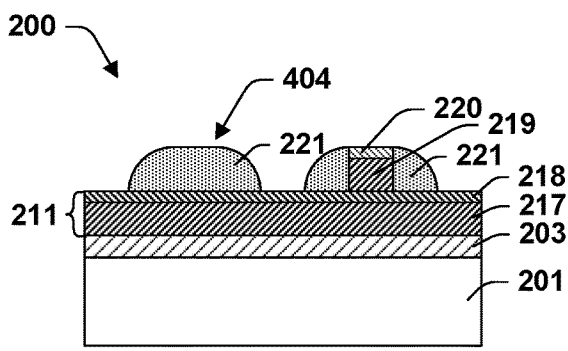
Figure 57:
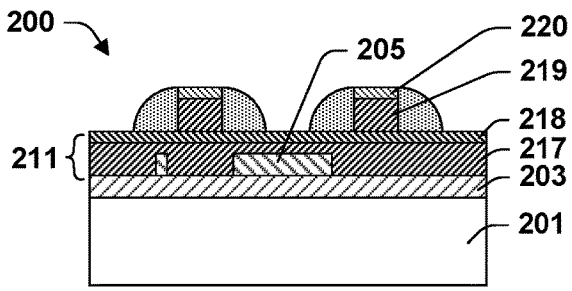
Figure 58:
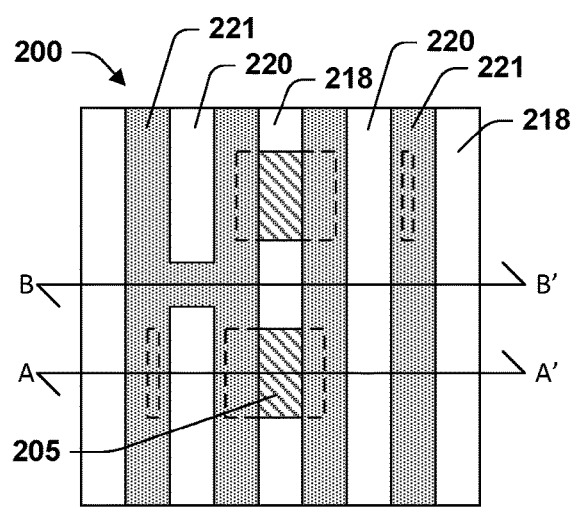
Figure 59:
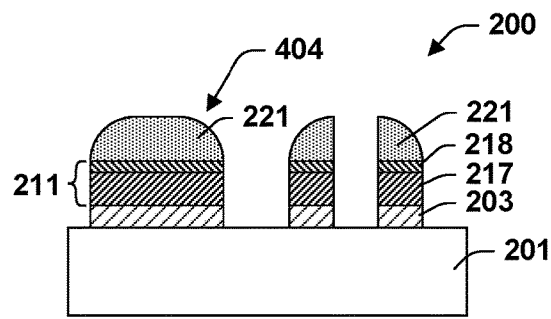
Figure 60:
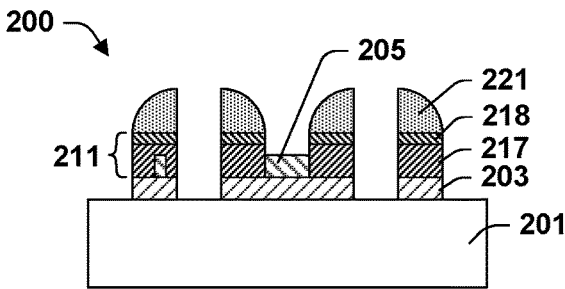
Figure 61:
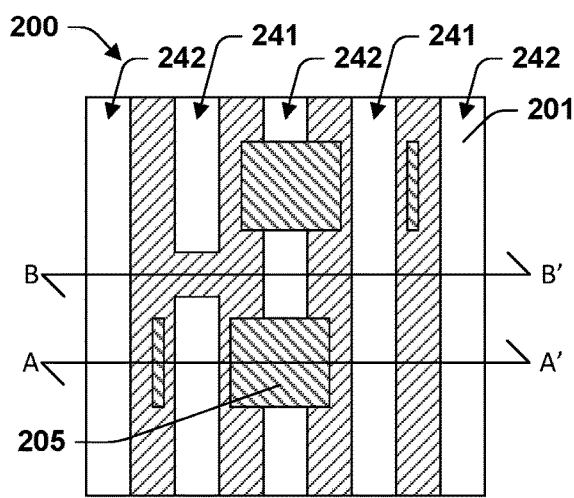
Figure 62:
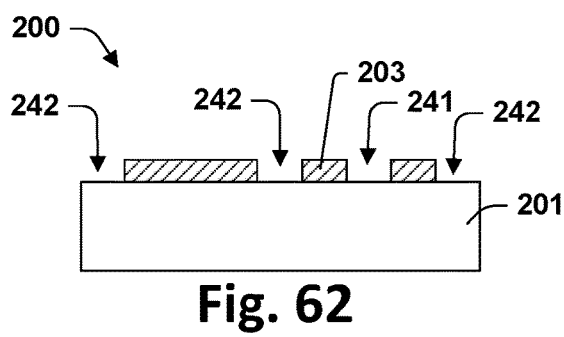
Figure 63:
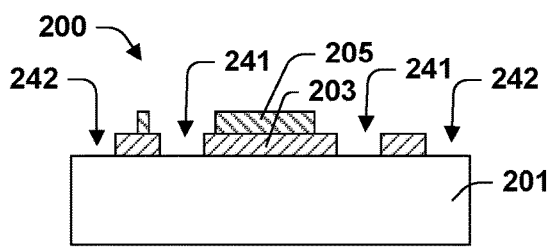
Figure 65:
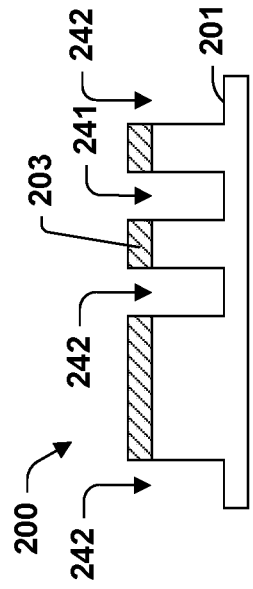
Figure 66:
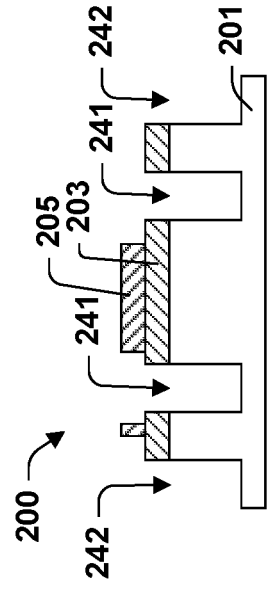
Figure 64:
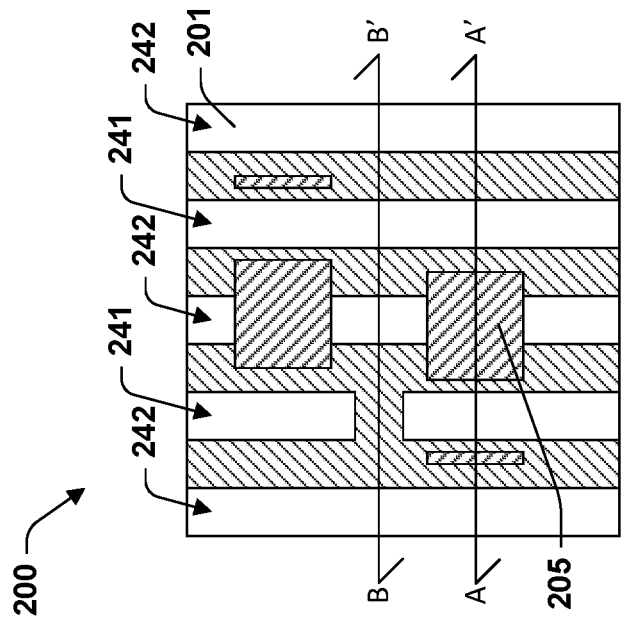

The components of process 350 are similar to those of process 250. Process 350 includes act 251, which forms the inverse-patterned PR2 301 for trimming the line termini-defining HM2 205. The description of process 250 generally applies to process 350. The principle difference is the addition of acts 351 to 353 to self-aligned double patterning 140. Acts 351 to 353 form gaps 406 in the mandrel SHM2 213 as shown in FIGS. 52-54. In process 350, spacer formation 146 fills gaps 406 with blocks 404 of spacer material 221 as shown in FIGS. 55-57. The block 404 of spacer material 221 form termini 243 for lines 241 as shown in FIGS. 58-66.

Figure 46:
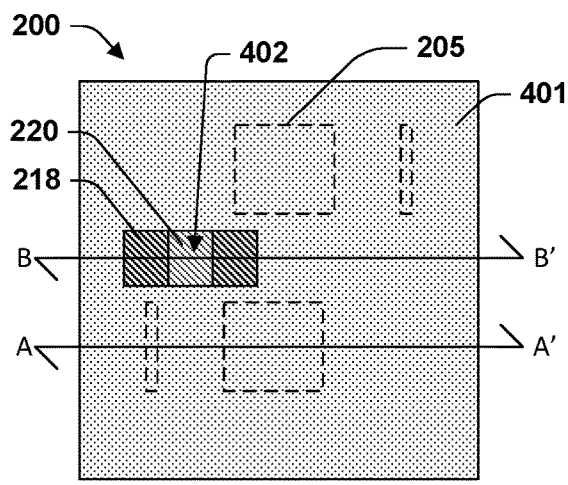
FIG. 46 provides a partial plan view of an example integrated circuit device to which the process of FIG. 45 can be applied.
Figure 47:
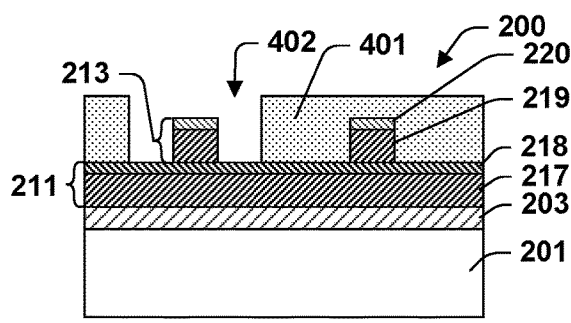
FIG. 47 is a cross section of the device illustrated by FIG. 46 taken along the line B-B'.
Figure 48:
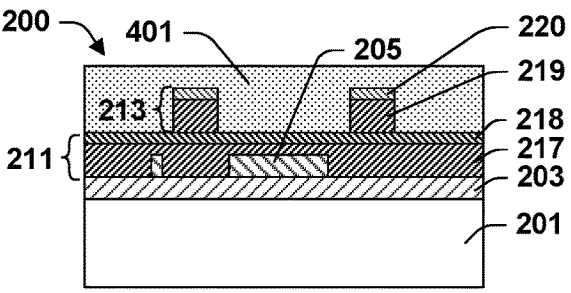
FIG. 48 is a cross section of the device illustrated by FIG. 46 taken along the line A-A'.
Figure 49:
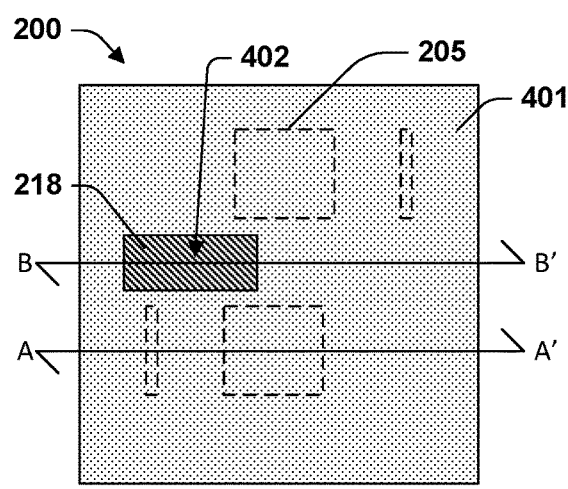
FIGS. 49-66 are a series of plan and cross-sectional views, each group of three representing the device at a single stage, the collected views showing progression of the example integrated circuit device of FIGS. 46-48 through processing by the method of FIG. 45.
Figure 50:
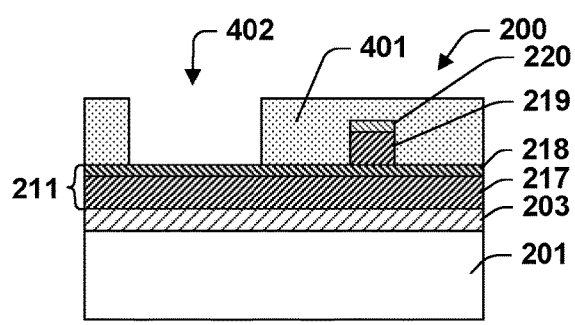
Figure 51:
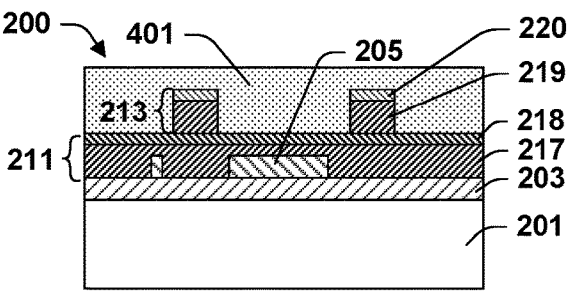

Act 351 forms and patterns a photoresist (PR4) 401. Patterning forms windows 402 in photoresist 401 as illustrated by FIGS. 46-48. Windows 402 expose the mandrel SHM2 213 at location were gaps 406 are desired. Act 352 is an etching operation for which PR4 401 provides a mask and SHM1 211 providing an etch stop. In terms of the layers removed, this is similar to act 144, which applies the mandrel pattern to SHM2 213. However, whereas in act 144 SHM1 211 is only exposed during the latter staged of the etching procedure, in act 352 a portion of SHM1 211 is exposed throughout the etching process. Accordingly, the selection of suitable materials for process 350 is more demanding as compared process 250.

In some alternative embodiments to process 350, the mandrel SHM2 213 is formed with gaps 406, which eliminates the need for PR4 401. As one example, following exposure of PR3 215 though the photolithographic mask PM1 in act 144, PR3 215 is again exposed through the gap-defining mask of act 351. Developing the PR3 215 and using it to pattern SHM2 213 in act 144 then forms SHM2 213 to the mandrel with gaps as shown ion FIGS. 52-54.

In one example of process 350, the base material etched in act 161 is a low k dielectric. HM1 203 is either a Ti, Ta, or a compound of Ti or Ta. HM2 205 is a silicon compound such as SiO, SiC, or SiN. SHM1 211 each include a carbon-based lower layer and a silicon-containing upper layer.

In some embodiments the substrate 201 includes a semiconductor body and one or more device structures formed during front-end of line (FEOL) processing. Examples of semiconductors include, without limitation, silicon, silicon on insulator (SOI), Ge, SiC, GaAs, GaAlAs, InP, GaN SiGe. Device structures formed during FEOL processing can include, without limitation, memory devices, logical devices, FETs and components thereof such as source regions, drain regions, and gate electrodes, active devices, passive devices, and combinations thereof. The substrate 201 can also include insulators, conductors, and previously formed interconnect structures, including structures formed during back-end of line (BEOL) processing. An upper layer of the substrate 201 can be a dielectric or a sacrificial layer in which a metal interconnect structure is to be formed.

In some embodiments, act 161 forms trenches in a layer of low-k dielectric. A low-k dielectric is one having a lower dielectric constant than silicon dioxide. Examples of low-k dielectrics include organosilicate glasses (OSG) such as carbon-doped silicon dioxide, fluorine-doped silicon dioxide (otherwise referred to as fluorinated silica glass(or FSG), and organic polymer low-k dielectrics. Examples of organic polymer low-k dielectrics include polyarylene ether, polyimide (PI), benzocyclbbutene, and amorphous polytetrafluoroethylene (PTFE).

HM1 203 can be formed from one or more layers of any suitable material or combination of materials. A suitable HM1 203 can have a composition adapted to the requirements of further processing 160. A suitable HM1 203 can be functional as an etch stop layer for etching HM2 205. A suitable HM1 203 can be etched while HM2 205 and spacers 221 operate as masks. In some embodiments, HM1 203 includes at least one layer of a material selected from the group consisting of Ti, TiN, Ta, and TaN. HM1 203 can be deposited by any suitable method. Examples of methods that can be suitable include, without limitation, physical vapor deposition (PVD), chemical vapor deposition (CVD), and atomic layer deposition (ALD).

HM1 205 can be formed from one or more layers of any suitable material or combination of materials. A suitable HM2 205 can be functional as a mask for etching HM1 203. In some embodiments, HM1 203 includes at least one layer of a material selected from the group consisting of SiO, SiC, and SiN. HM2 205 can be deposited by any suitable method. Examples of methods that can be suitable include, without limitation, plasma enhanced chemical vapor deposition (PECVD), chemical vapor deposition (CVD), and atomic layer deposition (ALD).

SHM1 211 can be formed from one or more layers of any suitable material or combination of materials. A suitable SHM1 211 can be functional to provide a planar surface on which to form spacers 211 and to form and pattern SHM2 213 (the mandrel). In some embodiments, SHM1 211 includes at least an upper layer of a material selected from the group consisting of a Si-containing anti-reflective coating (BARC) material such as SiON or SiN. In some embodiments, SHM1 211 includes at least a lower layer of a material of a carbon-based material selected from the group consisting of spin-on carbon, photoresist, and advanced patterning film (APF). The layers of SHM1 211 can be deposited by any suitable method. Examples of methods that can be suitable include, without limitation, spin coating, plasma enhanced chemical vapor deposition (PECVD), chemical vapor deposition (CVD), and atomic layer deposition (ALD).

SHM2 213 can be formed from one or more layers of any suitable material or combination of materials. A suitable SHM2 213 can be functional to provide a mandrel for forming spacers 211. In some embodiments, SHM2 213 is a photoresist. In some embodiments, SHM2 213 includes at least an upper layer of a material selected from the group consisting of a Si-containing anti-reflective coating (BARC) material such as SiON or SiN. In some embodiments, SHM2 213 includes at least a lower layer of a material of a carbon-based material selected from the group consisting of spin-on carbon, photoresist, and advanced patterning film (APF). The layers of SHM2 213 can be deposited by any suitable method. Examples of methods that can be suitable include, without limitation, spin coating, plasma enhanced chemical vapor deposition (PECVD), chemical vapor deposition (CVD), and atomic layer deposition (ALD).

The photoresists PR1 207, PR2 209, PR3 215, PR3 301, and PR4 401 can be formed by any suitable processes and from any suitable materials. A typical process is spin coating. Spin coating has the advantage of providing the photoresist with a comparatively uniform surface even when the underlying surface is comparatively irregular. The photoresists can be positive or negative and can be patterned by any suitable process. Patterning can involve selective exposure to light, the selectivity being defined by photolithographic masks through which the light passes. Exposure modifies the photoresist in such a way that in subsequent development either only the exposed portions are removed, which is the case for a positive resist, or only the unexposed portions are removed, which is the case for a negative photoresist. Photoresists can be stripped by any suitable processes. A positive photoresist can be stripped, for example, by non-selective exposure followed by developing.

The present disclosure refers to horizontal and vertical directions. The meaning of these terms is self-evident in the figures. More generally, the vertical direction is the direction of run for a group of lines 241 and 242 generated by self-aligned double patterning 140. The vertical direction may vary over disparate areas of the substrate 201, but locally there is only one direction to which this description applies. The horizontal direction is perpendicular to the vertical direction.

Lines 241 are portions of line-shaped features of the mandrel SHM2 213. Line-shaped features are elongated structures. They need not be straight, but any curvature is generally gradual. A large degree of curvature may be evident in an overview of a line-shaped feature, but when focusing on a small portion or area of a line shaped feature, in general, little or no curvature is evident.

Therefore, the present disclosure relates to self-aligned double patterning methods that can be used in back-end-of-line (BEOL) processing and other stages of integrated circuit device manufacturing, and associated apparatus.

In some embodiments, the disclosure recites a method of forming an integrated circuit. The method includes forming a first mask layer over a substrate and a second mask layer over the first mask layer. The second mask layer is patterned to form cut regions. The cut regions comprise a part of the second mask layer remaining after patterning. A mandrel is formed directly over the first mask layer after patterning the second mask layer. The first mask layer is etched according to a sacrificial mask formed using the mandrel and according to the cut regions to form a patterned first mask. The cut regions extend from within the sacrificial mask to laterally past sidewalls of the sacrificial mask. The substrate is processed according to the patterned first mask.

In other embodiments, the disclosure relates to a method of forming an integrated circuit. The method includes forming a first mask layer over a substrate and a second mask layer over the first mask layer. A first part of the second mask layer is removed to form cut regions comprising a second part of the second mask layer. The first mask layer is etched according to a sacrificial mask and according to the cut regions to form a patterned first mask. The cut regions extend from within the sacrificial mask to laterally past sidewalls of the sacrificial mask. The substrate is processed according to the patterned first mask In yet other embodiments, the disclosure relates to a method of forming an integrated circuit. The method includes forming a first hard mask layer over a substrate, and forming a second hard mask layer over the first hard mask layer. The second hard mask layer is patterned to form islands. A self-aligned double-patterning of the first hard mask layer is performed using the patterned second hard mask layer. The self-aligned double-patterning comprises etching the first hard mask layer according to a sacrificial mask and according to the islands, which extend from within the sacrificial mask to laterally past sidewalls of the sacrificial mask, to form line-shaped openings in the first hard mask layer. The islands mask termini of the line-shaped openings.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The claims are:

1. A method of forming an integrated circuit, comprising:
forming a hard mask over a dielectric layer of a substrate;
forming a blocking layer on the hard mask;
forming spacers over the blocking layer, wherein the spacers laterally straddle opposing edges of the blocking layer;
etching the hard mask according to the spacers and the blocking layer; and
etching the dielectric layer according to the hard mask.

2. The method of claim 1,
wherein the spacers comprise a first sidewall and a second sidewall directly over the blocking layer, the first sidewall separated from the second sidewall by a non-zero distance; and
wherein the first sidewall and the second sidewall continuously extend past opposing sides of the blocking layer.

3. The method of claim 1, wherein the blocking layer is formed to contact an upper surface of the hard mask.

4. The method of claim 1, further comprising:
forming the blocking layer on the hard mask; and
patterning the blocking layer using lithography prior to forming the spacers.

5. The method of claim 1, wherein the blocking layer is located vertically over the hard mask and laterally between ends of adjacent trenches in the hard mask.

6. The method of claim 1, further comprising:
forming a masking layer over the dielectric layer and the blocking layer;
patterning the masking layer to define a patterned masking layer; and
forming the spacers along opposing sidewalls of the patterned masking layer and directly over the blocking layer.

7. The method of claim 6, wherein the masking layer is formed to have a greater height than the blocking layer.

8. The method of claim 1, wherein the blocking layer comprises silicon and an oxide.

9. A method of forming an integrated circuit, comprising:
depositing a hard mask over a dielectric layer;
forming a blocking layer over a portion of the hard mask;
forming a first masking segment and a second masking segment over the blocking layer, wherein the first masking segment laterally extends from a first sidewall over the blocking layer to beyond a first side of the blocking layer and the second masking segment laterally extends from a second sidewall over the blocking layer to beyond a second side of the blocking layer that opposes the first side; and
etching the hard mask according to the first masking segment, the second masking segment, and the blocking layer.

10. The method of claim 9, wherein the first masking segment is arranged along a sidewall and an upper surface of the blocking layer.

11. The method of claim 9, wherein the first masking segment, the second masking segment, and the blocking layer contact an upper surface of the hard mask.

12. The method of claim 9, wherein an upper surface of the blocking layer is exposed between the first sidewall of the first masking segment and the second sidewall of the second masking segment.

13. The method of claim 12,
wherein the first sidewall of the first masking segment and the second sidewall of the second masking segment are separated from one another along a first direction; and
wherein the first sidewall of the first masking segment and the second sidewall of the second masking segment continuously extend past opposing sides of the blocking layer along a second direction that is perpendicular to the first direction.

14. The method of claim 9, wherein the blocking layer is a rectangular shape as viewed from a top view of the blocking layer.

15. A method of forming an integrated circuit, comprising:
forming a hard mask over a dielectric layer;
forming a blocking layer over a portion of the hard mask;
forming a mandrel over the hard mask;
forming spacers along opposing sides of the mandrel;
removing the mandrel after forming the spacers, wherein an upper surface of the blocking layer is exposed after removing the mandrel; and
etching the hard mask according to the spacers and the blocking layer.

16. The method of claim 15, further comprising:
forming a second mandrel over the hard mask, wherein the mandrel is laterally spaced from the second mandrel; and
forming second spacers along sides of the second mandrel.

17. The method of claim 16, further comprising:
etching the hard mask according to the second spacers to define a sidewall of the hard mask that continuously extends past opposing sides of the blocking layer.

18. The method of claim 15, wherein the spacers extend past opposing edges of the blocking layer.

19. The method of claim 15, wherein the spacers have overlapping relationships with opposite side edges of the blocking layer.

20. The method of claim 15, wherein the blocking layer comprises an oxide.

* * * * *